United States Patent
Takaya et al.

(10) Patent No.: US 8,076,718 B2
(45) Date of Patent: Dec. 13, 2011

(54) INSULATED GATE SEMICONDUCTOR DEVICE AND METHOD FOR PRODUCING THE SAME

(75) Inventors: Hidefumi Takaya, Nishikamo-gun (JP); Kimimori Hamada, Toyota (JP); Kyosuke Miyagi, Nishikamo-gun (JP); Yasushi Okura, Toyokawa (JP); Akira Kuroyanagi, Okazaki (JP); Norihito Tokura, Okazaki (JP)

(73) Assignees: Toyota Jidosha Kabushiki Kaisha, Toyota-shi (JP); Denso Corporation, Kariya-shi (JP)

( * ) Notice: Subject to any disclaimer, the term of this patent is extended or adjusted under 35 U.S.C. 154(b) by 1264 days.

(21) Appl. No.: 11/666,461

(22) PCT Filed: Sep. 28, 2005

(86) PCT No.: PCT/JP2005/018406
§ 371 (c)(1),
(2), (4) Date: Apr. 27, 2007

(87) PCT Pub. No.: WO2006/046388
PCT Pub. Date: May 4, 2006

(65) Prior Publication Data
US 2008/0087951 A1  Apr. 17, 2008

(30) Foreign Application Priority Data

Oct. 29, 2004  (JP) .................................. 2004-316912

(51) Int. Cl.
  *H01L 29/66*  (2006.01)
(52) U.S. Cl. ................. 257/330; 257/332; 257/E21.429; 438/270; 438/272

(58) Field of Classification Search .................. 257/330, 257/334, 341, 342, 332, E27.26, E21.429; 438/270, 272
See application file for complete search history.

(56) References Cited

U.S. PATENT DOCUMENTS

| | | | | |
|---|---|---|---|---|
| 5,665,996 | A * | 9/1997 | Williams et al. | 257/401 |
| 6,194,741 | B1 * | 2/2001 | Kinzer et al. | 257/77 |
| 6,342,709 | B1 * | 1/2002 | Sugawara et al. | 257/139 |
| 6,462,376 | B1 * | 10/2002 | Wahl et al. | 257/331 |
| 6,936,893 | B2 * | 8/2005 | Tanaka et al. | 257/341 |
| 7,154,177 | B2 * | 12/2006 | Van Dalen et al. | 257/750 |
| 7,339,237 | B2 * | 3/2008 | Meyer | 257/349 |
| 2003/0001215 | A1 * | 1/2003 | Wahl et al. | 257/401 |

(Continued)

FOREIGN PATENT DOCUMENTS

| | | |
|---|---|---|
| DE | 102 19 398 A1 | 11/2003 |
| DE | 102 31 966 A1 | 2/2004 |
| EP | 0 893 830 A1 | 1/1999 |

(Continued)

*Primary Examiner* — Meiya Li
(74) *Attorney, Agent, or Firm* — Kenyon & Kenyon LLP

(57) ABSTRACT

The invention has an object to provide an insulation gate type semiconductor device and a method for producing the same in which high breakdown voltage and compactness are achieved. The semiconductor device has a gate trench and a P floating region formed in the cell area and has a terminal trench and a P floating region formed in the terminal area. In addition, a terminal trench of three terminal trenches has a structure similar to that of the gate trench, and the other terminal trenches have a structure in which an insulation substance such as oxide silicon is filled. Also, the P floating region 51 is an area formed by implanting impurities from the bottom surface of the gate trench, and the P floating region is an area formed by implanting impurities from the bottom surface of the terminal trench.

8 Claims, 15 Drawing Sheets

U.S. PATENT DOCUMENTS

| | | | |
|---|---|---|---|
| 2003/0022474 A1* | 1/2003 | Grover et al. | 438/570 |
| 2003/0042556 A1* | 3/2003 | Gajda et al. | 257/401 |
| 2003/0047776 A1* | 3/2003 | Hueting et al. | 257/328 |
| 2004/0056302 A1 | 3/2004 | Grebs et al. | |
| 2004/0262677 A1 | 12/2004 | Harada | |
| 2005/0230744 A1* | 10/2005 | Wu | 257/330 |
| 2007/0001230 A1* | 1/2007 | Lee et al. | 257/367 |

FOREIGN PATENT DOCUMENTS

| | | | |
|---|---|---|---|
| JP | 11-017179 | | 1/1999 |
| JP | 11-87698 | * | 3/1999 |
| JP | 2001-015744 A | | 1/2001 |
| JP | 2005-116822 A | | 4/2005 |
| WO | WO 99/52152 A | | 10/1999 |

* cited by examiner

FIG. 5
(a)
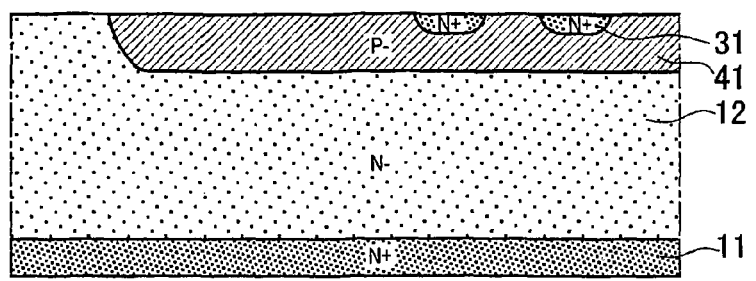
(b)
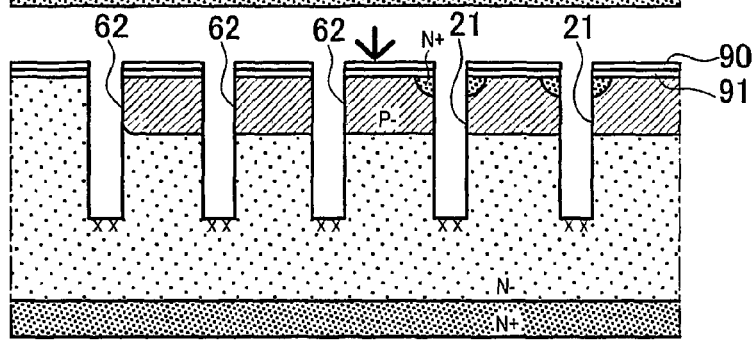
(c)
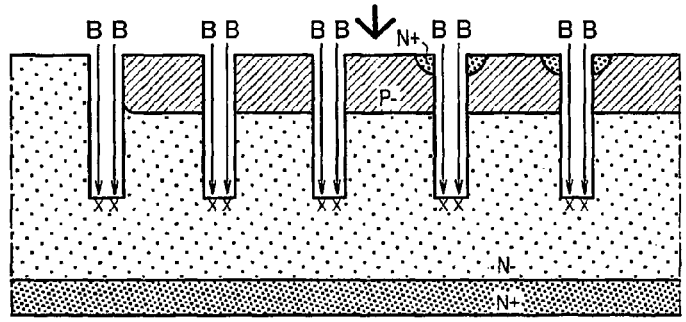
(d)
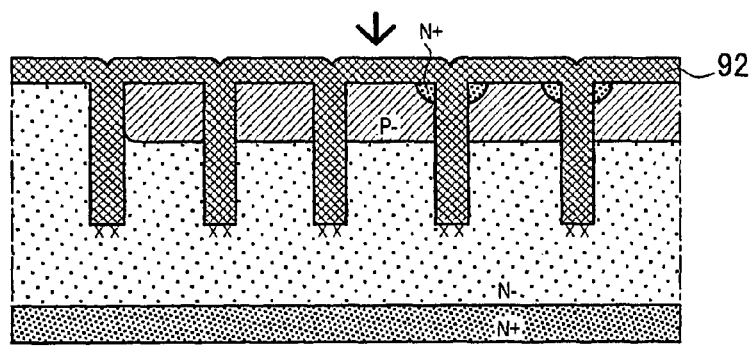
(e)
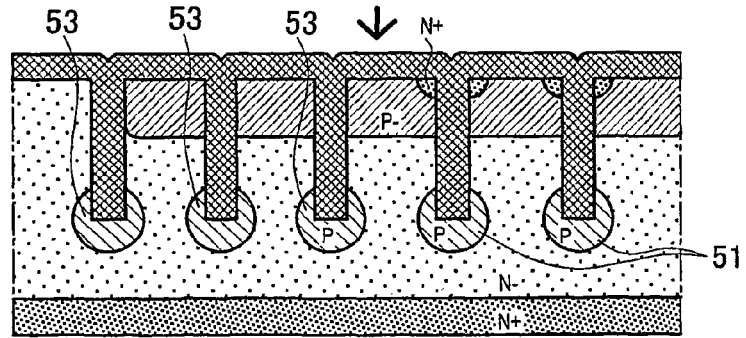

PRIOR ART

INSULATED GATE SEMICONDUCTOR DEVICE AND METHOD FOR PRODUCING THE SAME

This is a 371 national phase application of PCT/JP2005/018406 filed 28 Sep. 2005, which claims priority of Japanese Patent Application No. 2004-316912 filed 29 Oct. 2004, the contents of which are incorporated herein by reference.

FIELD OF THE INVENTION

The present invention relates to an insulation gate type semiconductor device having a trench gate structure. In particular, the invention relates to an insulation gate type semiconductor device having floating regions beneath trenches and capable of securely achieving high breakdown voltage by relieving an electric field applied to a semiconductor layer.

BACKGROUND OF THE INVENTION

Conventionally, a trench gate type semiconductor device having a trench gate structure has been proposed as an insulation gate type semiconductor device for a power device. In the trench gate type semiconductor device, generally, high breakdown voltage and low on resistance are in the relationship of trade-off.

The present applicant has proposed an insulation gate type semiconductor device 900 as depicted in FIG. 14 as a trench gate type semiconductor device that solved the problem (Japanese Patent Application No. 2003-349806 (Japanese Published Unexamined Patent Application No. 2005-116822)). The insulation gate type semiconductor device 900 is provided with N+ source regions 31, an N+ drain region 11, a P− body region 41, and an N− drift region 12. Also, gate trenches 21 that passes through the N+ source region 31 and P− body region 41 is formed by trenching a part of the upper surface of a semiconductor substrate. Further, a deposited insulating layer 23 is formed on the bottom of the gate trench 21 by deposition of an insulator. Also, a gate electrode 22 is formed on the deposited insulating layer 23. And, the gate electrode 22 is faced to the N+ source region 31 and P− body region 41 via a gate insulating film 24 formed on the wall surface of the gate trench 21. Further, P floating regions 51 is formed in the N− drift region 12. And, the lower end of the gate trench 21 is positioned in the P floating region 51.

The insulation gate type semiconductor device 900 is provided with the P floating region 51 in the N− drift region 12 and has the following characteristics in comparison with the insulation gate type semiconductor device not having the same. That is, when the gate voltage is switched off, a depletion layer is formed from the PN junction point with the P− body region 41 in the N− drift region 12 by voltage between the drain and the source (hereinafter called "between D and S"). And, the peak of electric field intensity is brought about in the vicinity of the PN junction point. As the tip end of the depletion layer reaches the P floating region 51, the P floating region becomes in a punched-through state to cause the potential thereof to be fixed. Further, where the application voltage between D and S is high, a depletion layer is formed from the lower end part of the P floating region 51. And, the peak of electric field intensity is brought about in the vicinity of the lower end part of the P floating region 51 in addition to the PN junction points with the P− body region 41. That is, the peak of the electric field can be formed at two points, wherein the maximum peak value is lowered to achieve high breakdown voltage. Also, since high breakdown voltage is secured, the impurity density of the N− drift region 12 is raised to achieve low on resistance.

In addition, the insulation gate type semiconductor device 900 is provided, at the terminal area thereof, with terminal trenches 62, which is composed so as to pass through the P− body region 41, and a P floating region 53, which is formed by implanting impurities through the bottom part of the terminal trench 62, as shown in FIG. 15. Therefore, production thereof can be simplified, and the terminal area can be made compact.

In detail, since, in the insulation gate type semiconductor device 900, the structure of the terminal area is almost the same as a cell area structure, a number of processes can be commonly used in both the areas. That is, since it is possible to simultaneously carry out processing in both the areas, the production can be simplified.

Also, as in the prior arts, if it is in the manner that the breakdown voltage of the terminal area is retained by guard rings, it is necessary to secure an area equivalent to or greater than the depletion layer spread toward the terminal area in the N− drift region 12 as an area of the guard ring layer. For this reason, the area of the guard ring layer hinders compaction of the entirety of a semiconductor device. On the other hand, in the insulation gate type semiconductor device 900, spread of the depletion layer spread in the N− drift region 12 in the plate surface direction (that is, in the N− lateral direction in FIG. 15) is interrupted by the terminal trench 62, and a lowering in the breakdown voltage in the terminal area by the P− floating region 53 as in the cell area is deterred. That is, high breakdown voltage can be achieved without spreading the terminal area.

In addition thereto, as a semiconductor device having a floating region in the drift region, in which spread of the terminal area is suppressed, for example, a semiconductor device disclosed by Patent Document 1 exists.

[Patent Document 1] Japanese Published Unexamined Patent Application No. 2001-15744

However, there are the following problems in the insulation gate type semiconductor device 900 described above. That is, although the breakdown voltage structure in the cell area and the breakdown voltage structure of the terminal area have roughly the same structure, they may differ from each other depending on whether or not a gate electrode is internally incorporated in the trench. For this reason, a difference arises in the spread of the depletion layer spread along the trench. Therefore, there may be a case where the breakdown voltage of the terminal area differs from the design breakdown voltage in the cell area. As a result, there may be a case where the breakdown voltage is lowered. For example, in the vicinity of the terminal trench 62 in which no gate electrode is internally incorporated, it is difficult for the depletion layer to spread in comparison with the vicinity of the gate trench 21. Accordingly, there is a fear that the depletion layer formed of PN junction points with the P− body region 41 is not connected to the depletion layer formed of the P floating region 53. Also, similarly, there is a fear that the depletion layer formed of the P floating region 51 is not connected to the depletion layer formed of the P floating region 53.

In addition, in regard to the semiconductor device disclosed by Patent Document 1, the breakdown voltage structure in the cell area differs from the breakdown voltage structure in the terminal area. That is, the depletion layers are different from each other in regard to the spread, wherein there may be cases where predetermined breakdown voltage cannot be obtained.

The present invention was developed to solve the problems that exist in the prior art semiconductor device described above. That is, it is therefore an object of the invention to provide an insulation gate type semiconductor device and a method for producing the insulation gate type semiconductor device, with which both high breakdown voltage and compactness can be secured.

SUMMARY OF THE INVENTION

To achieve the above purpose of the invention, there is provided an insulation gate type semiconductor device including a body region which is positioned on the upper surface inside a semiconductor substrate and is a first conductive type semiconductor; and a drift region which is in contact with the downward of the body region and is a second conductive type semiconductor; comprising: a first trench portion group passing through the body region in the thickness direction of the semiconductor substrate, positioned in a cell area, and internally incorporating a gate electrode; first floating regions enclosed by the drift region and surrounding the bottom portion of at least one trench portion in the first trench portion group, which is the first conductive type semiconductor; a second trench portion group passing through the body region in the thickness direction of the semiconductor substrate, positioned in the terminal area surrounding the cell area, and formed to be annular so as to surround the cell area when being viewed from above; and second floating regions enclosed by the drift region and surrounding the bottom portion of at least one trench portion in the second trench portion group, which is the first conductive type semiconductor; wherein a gate electrode is internally incorporated in at least the innermost positioned trench portion in the second trench portion group.

That is, in the insulation gate type semiconductor device according to the invention, a lowering in the breakdown voltage in the cell area is deterred by the first trench portion group internally incorporating a gate electrode, and the first floating region positioned downward of the respective trench portions in the first trench portion group. Further, a lowering in the breakdown voltage in the terminal area is deterred by the second trench portion group surrounding the cell areas and the second floating region positioned downward of the respective trench portions in the second trench portion group. Still further, a gate electrode is provided in at least the innermost trench portion, which is positioned extremely inward, in the second trench portion group, as in the respective trench portions that compose the first trench portion group.

Since at least the innermost trench portion, which is extremely inward, in the second trench portion group is provided with a gate electrode, the boundary phase portion between the cell area and the terminal area will have a breakdown voltage structure as in the cell area. Therefore, no difference is brought about in the spread of the depletion layer at both the cell area side and the terminal area side in the boundary phase portion. Accordingly, depletion in the drift region can reliably be achieved, and high breakdown voltage of a semiconductor device can be securely achieved.

Further, at the terminal area, spread of the depletion layer toward the terminal area is interrupted by respective trench portions in the second trench portion group, whereby the shape of the tip end portion of the depletion layer is flattened, and concentration of the electric field is relieved. And, it is possible to further relieve the peak in the electric field intensity by the second floating region secured downward of the respective trench portions. That is, it is possible to achieve high breakdown voltage without making the size of the terminal area large. Compactness of the entirety of the semiconductor device can be easily achieved.

Also, in the semiconductor device according to the invention, it is further preferable that at least the outermost trench portion, which is positioned extremely outward, in the second trench portion group is caused to have a gate⁻free structure. Herein, "gate⁻free structure" refers to a structure not including any area which operates as a gate. In detail, for example, although the structure refers to a structure in which the interior of the trench is filled with an insulation layer, and a structure in which, although being internally incorporated with a polysilicon area as in the trench portions composing the first trench portion group, the area is not electrically connected to the gate electrode.

Also, in the insulation gate type semiconductor according to the invention, it is preferable that only the innermost trench portion, which is positioned extremely inward, in the second trench portion group is provided with a gate electrode. That is, if a gate electrode is provided in trench portions other than the innermost trench portion, which is positioned extremely inward, in the second trench portion group, it is necessary to extend the end area to a further outer area in order to improve the breakdown voltage in the vicinity of the gate electrode. For this reason, it hinders compactness of the entirety of the semiconductor device. Therefore, it is preferable in view of making the semiconductor device compact that the trench portion having a gate electrode internally incorporated therein is only the innermost trench portion, which is positioned extremely inward, in the second trench portion group.

It is further preferable that the pitches of the respective trench portions in the second trench portion group of the insulation gate type semiconductor device according to the invention are narrower than those of the respective trench portions in the first trench portion group. That is, since the terminal area in which the second trench portion group is provided is an inactive area, no drift current flows. Therefore, there is no case where the ON resistance is increased even if the interval between the second floating regions is made narrow. Therefore, by narrowing the pitches of the respective trench portions in the second trench portion group, that is, narrowing the interval between the second floating regions, it becomes easier for the depletion layers to be connected, wherein higher breakdown voltage of the terminal area can be obtained.

Also, in the insulation gate type semiconductor device according to the invention, it is preferable that the trench portion which is positioned inward is made deeper than the trench portions adjacent to each other in the second trench portion group. That is, by making gradually shallower the depth of the respective trench portions in the second trench portion group from inward to outward, the curvature of the tip end portion of the depletion layer can be reduced. Therefore, higher breakdown voltage of the terminal area can be achieved.

Further, in the insulation gate type semiconductor device according to the invention, it is preferable that the depth of the respective trench portions in the second trench portion group is made deeper than the depth of the respective trench portions in the first trench portion group. That is, since the terminal area is an inactive area, no breakdown current flows. Therefore, if any insulation breakage occurs in the terminal area, there is a fear that a device is broken down. Therefore, the depth of the respective trench portions in the second trench portion group is made deeper than the depth of the respective trench portions in the first trench portion group. That is, by making the position of the second floating region deeper than the position of the first floating region, the thickness of the depletion spread in the terminal area is made thicker than the thickness of the cell area, whereby the terminal area is made into higher breakdown voltage than in the cell area, and it is possible to prevent insulation breakdown in the terminal area.

Also, in the insulation gate type semiconductor device described above, it is preferable that the groove width of the respective trench portions in the second trench portion group is made wider than the groove width of the respective trench portions in the first trench portion group. That is, since the widths of the trench portions differ from each other, etching is carried out to a deeper groove position by a micro-loading effect in the trenches, whose groove width is wider, even if the etching is carried out under the same conditions. Further, since the groove width is wide, the size of the floating region formed downward of the respective trench portions is made larger. Therefore, only by making the groove of the trenches wider when executing patterning, the position of the second floating region can be made deeper.

Also, in the insulation gate type semiconductor device according to the invention, it is further preferable that the end portion of the body region in the plate surface direction is positioned further inward of the outermost trench portion, which is positioned extremely outward, in the second trench portion group. That is, by the end portion of the body region in the plate surface direction being positioned further inward of the outermost trench portion, the depletion layer spread in the plate surface direction from the boundary phase with the body region is interrupted by the wall surface of the trench portion in the second trench portion group. For this reason, it is possible to reduce the size of the terminal area, and compactness of the entirety of the semiconductor device can be achieved.

Further, according to another aspect of the invention, there is provided a method for producing an insulation gate type semiconductor device including a body region which is positioned on the upper surface inside a semiconductor substrate and is a first conductive type semiconductor; and a drift region which is in contact with the downward of the body region and is a second conductive type semiconductor; comprising the steps of: forming a mask pattern to form the first trench portion group positioned in the cell area and the second trench portion group, which is positioned in the terminal area surrounding the cell area and surrounds the first trench portion group; forming trench portions to compose respective trench portions by etching on the basis of the mask pattern formed in the mask pattern forming step; implanting impurities to form floating regions, which is the first conductive type semiconductor, by implanting impurities from the bottom parts of respective trench portions formed in the trench portion forming step; forming a deposition insulation layer by depositing an insulation substance in respective trench portions formed in the trench portion forming step; etching back to form an etching protection layer in which the upper part of at least the innermost positioned trench portion in the second trench portion group is open, and to remove a part of the deposition insulation layer formed in the deposition insulation layer forming step; and forming a gate electrode in a space produced in respective trench portions in the etching-back step.

That is, with a method for producing the insulation gate type semiconductor device according to the present invention, both the first trench portion group positioned in the cell area and the second trench portion group positioned in the terminal area are simultaneously formed in the step of forming the trench portions. Further, both the gate electrode internally incorporated in the trench portions in the first trench portion group and the gate electrode internally incorporated in the trench portions in the second trench portion group are simultaneously formed in the step of forming gate electrodes.

That is, in addition to the step of forming the trench portions and the floating regions, the step of forming gate electrodes is commonly employed in the cell area and the terminal area. Therefore, even if the gate electrode is provided in the terminal area, the production process is simplified.

Furthermore, it is preferable that the method for producing an insulation gate type semiconductor device according to the invention also includes a step of forming a protective layer, whose etching rate in the trench portion forming step is greater than in the mask layer formed in the mask pattern forming step, on a part of a semiconductor substrate. That is, the engraving start time is delayed at the portion where the protective layer is provided. That is, it is possible to form trench portions whose depths are different from each other, in a single trench portion forming step.

BRIEF DESCRIPTION OF DRAWINGS

FIG. 5 is a view (Part 1) showing a process of producing a trench gate type semiconductor device shown in FIG. 2;

DETAILED DESCRIPTION

Hereinafter, a detailed description is given of an embodiment in which the invention, with reference to the accompanying drawings. Also, the present embodiment is such that the invention is applied to a power MOS of controlling conductivity between the drain and source (D and S) by voltage application to an insulation gate.

An insulation gate type semiconductor device 100 (hereinafter called a "semiconductor device 100") according to the embodiment has a structure shown in a plan perspective view of FIG. 1 and a sectional view of FIG. 2. Also, it is assumed, in the present description, that the entirety in which a starting substrate and a portion of single crystal silicon formed by epitaxial growth on the starting substrate are combined is called a "semiconductor substrate."

Figure 1:
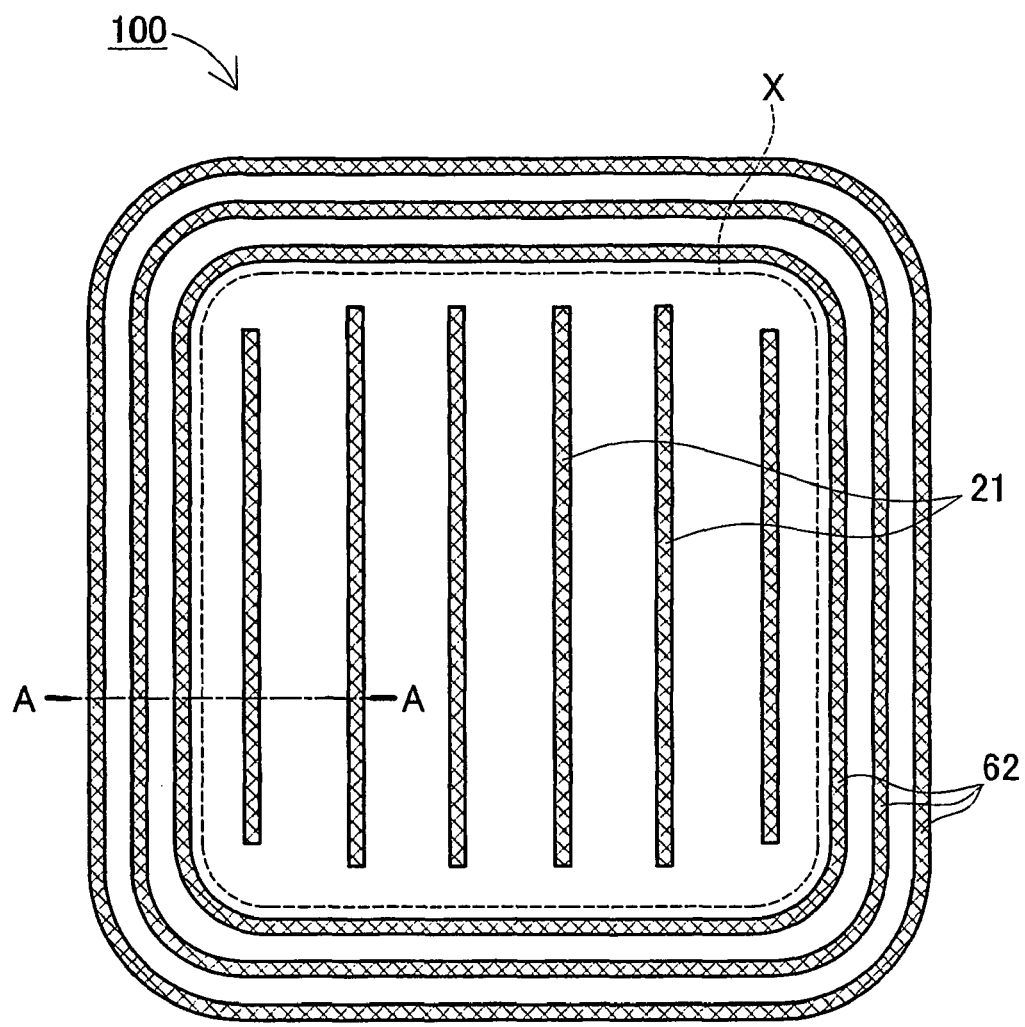
FIG. 1 is a plan view showing a structure of an insulation gate type semiconductor device according to an embodiment.

A semiconductor device 100 of this mode is composed of a cell area (inside the broken line X in FIG. 1) in which a current flows as shown in FIG. 1 and a terminal area (outside the broken line X in FIG. 1) surrounding the cell area. That is, the cell area in the semiconductor device 100 is sectioned by the terminal area. And, a plurality of gate trenches 21 are provided in the cell area of the semiconductor device 100 and a plurality of terminal trenches 62 are provided in the terminal area, respectively. Further, the gate trenches 21 are disposed in the form of stripes while the terminal trenches 62 are concentrically disposed so as to enclose the cell area.

Figure 2:
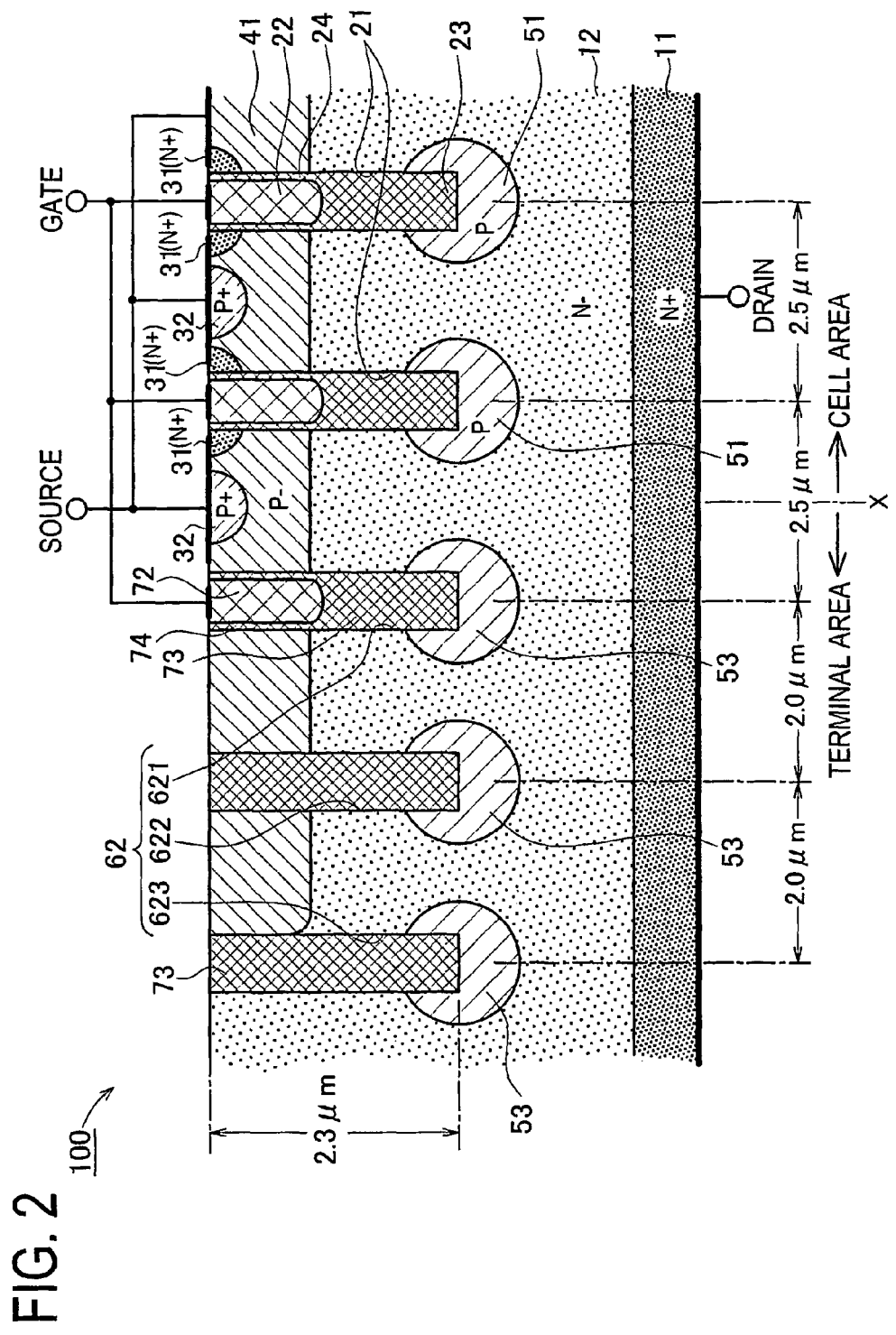
FIG. 2 is a sectional view taken along the line A-A of the insulation gate type semiconductor device shown in FIG. 1.

FIG. 2 is a view showing a section taken along the line A-A of the semiconductor device 100 shown in FIG. 1. In the semiconductor device 100 according to the embodiment, a source electrode is provided on the upper surface side of the semiconductor substrate in FIG. 2 while a drain electrode is provided on the lower surface side therein. In addition, in the semiconductor substrate, $N^+$ source regions 31 and contact $P^+$ regions 32 are provided on the upper surface side, and a $N^+$ drain region 11 is provided on the lower surface side, respectively. Also, a $P^-$ body region 41 and an $N^-$ drift region 12 are provided in order from the upper surface side between the $N^+$ source regions 31 and the $N^+$ drain region 11.

Further, the gate trenches 21 and the terminal trenches 62 are formed by engraving a part of the upper surface side of the semiconductor substrate. The depth of the respective trenches is about 2.3 μm, and the respective trenches are caused to pass through the $P^-$ body region 41. And, the gate trenches 21 are formed with a pitch of about 2.5 μm while the terminal trenches 62 are formed with a pitch of about 2.0 μm.

Also, a deposited insulating layer 23 is formed on the bottom parts of the gate trenches 21 by deposition of an insulation substance. In detail, the deposited insulating layer 23 according to the embodiment is produced by silicon oxide being deposited to a height of about 1.1 μm from the bottom part of the gate trench 21. Further, a gate electrode 22 is formed on the deposited insulating layer 23. The lower end of the gate electrode 22 is positioned downward of the underside of the $P^-$ body region 41. And, the gate electrode 22 is faced to the $N^+$ source region 31 and $P^-$ body region 41 of the semiconductor substrate via a gate insulating film 24 formed on the wall surface of the gate trench 21. That is, the gate electrode 22 is insulated from the $N^+$ source region 31 and $P^-$ body region 41 by means of the gate insulating film 24.

The following characteristics are brought about by the deposited insulating layer 23 being provided in the gate trench 21. That is, since the P floating region 51 is formed by ion implantation, etc., through the bottom part of the trench 21 as described later, damage is brought about more or less on the bottom part of the trench 21. However, influence due to damage of the bottom part of the trench 21 can be avoided by the existence of the deposited insulating layer 23, and it is possible to deter the device characteristics from deteriorating and to deter the reliability from being lowered. Also, influence resulting from facing of the gate electrode 22 and the P floating region 51 together is relieved by the deposited insulating layer 23, wherein it is possible to lower the ON resistance in the $P^-$ body region 41. In addition, the gate electrode 22 is made small in comparison with a case where the deposited insulating layer 23 is not provided, that is, a case where the gate electrode 22 and the P floating region 51 are faced to each other. Therefore, capacitance Cgd between the gate and drain is small, wherein the switching speed is made fast.

Further, in the semiconductor device 100, a terminal trench 621 of three terminal trenches 62 (hereinafter, it is assumed that the terminal trenches 621, 622 and 623 are provided in order close to the cell area) has a structure similar to the gate trench 21. The other trenches have a structure which is filled with an insulation substance such as silicon oxide. That is, in the terminal trench 621 adjacent to the cell area, a gate electrode 72 is provided on a deposited insulating layer 73. Further, the gate electrode 72 is faced to the $P^-$ body region 41 of the semiconductor substrate via a gate insulation film 74 formed on the wall surface of the terminal trench 621. On the other hand, the terminal trenches 622 and 623 are filled with a deposited insulating layer 73 (that is, these have a gate-free structure).

In the semiconductor device 100 having such a structure, a channeling effect is brought about in the $P^-$ body region 41 by voltage application onto the gate electrode 22, whereby conductivity between the $N^+$ source regions 31 and the N+ drain region 11 is controlled.

Further, in the semiconductor device 100, P floating regions 51 and 53 surrounded by the $N^-$ drift region 12 are formed. Also, the P floating region 51 is an area in which impurities are implanted from the bottom surface of the gate trench 21, and the P floating region 53 is an area in which impurities are implanted from the bottom surface of the terminal trench 62. The sections of the respective P floating regions are made roughly circular centering around the bottom part of the respective trenches, whose radius is 0.6 μm. In addition, sufficient space in which a carrier moves is provided between the P floating regions 51 and 51 adjacent to each other. Therefore, in a state where the gate voltage is switched on, existence of the P floating region 51 does not hinder a drain current. On the other hand, the distances of the P floating regions 53 and 53 adjacent to each other is made shorter than the distance of the P floating regions 51 and 51. However, since no drift current flows in the terminal area, it does not hinder a low on resistance. Rather, it is preferable that the space enables secure connection of the depletion layer spread in the plate surface direction to the P floating region 53.

Also, the radius (about 0.6 μm) of the respective P floating region 51 is less than half the thickness (about 1.7 μm) of the deposited insulating layer 23. Therefore, the upper end of the deposited insulating layer 23 is located above the upper end of the P floating region 51. Therefore, the gate electrode 22 deposited on the deposited insulating layer 23 is not faced to the P floating region 51. For this reason, the device characteristics are not influenced.

The semiconductor device 100 according to the embodiment will have the following characteristics by the gate electrode 72 being provided in the innermost terminal trench 62 (the terminal trench 621). That is, in order that the structure of the terminal trench 621 is made similar to the structure of the gate trench 21, spread of the depletion layer in the vicinity of the terminal trench 621 is equal to that of the depletion layer in the vicinity of the gate trench 21. Therefore, it is possible to securely connect the depletion layer formed of PN junction points with the $P^-$ body region 41 to the depletion layer formed of the P floating region 53 in the vicinity of the terminal trench 621. Further, it is possible to securely connect the depletion layer formed of the P floating region 51 to the depletion layer formed of the P floating region 53, wherein design breakdown voltage can be obtained.

In addition, it is not preferable in view of the following point that a gate electrode is provided in all of the terminal trenches 62. That is, in the semiconductor device 100 according to the embodiment, an electric field is concentrated between the gate electrode and the N⁻ drift region 12. Therefore, if the gate electrode is also internally incorporated in the outermost terminal trench 623, it becomes necessary to extend the terminal area in order to deter the breakdown voltage in the vicinity of the gate electrode in the terminal trench 623 from being lowered. Accordingly, it hinders compactness of the terminal area. Thereby, in view of achieving the compactness, it is necessary that the outermost terminal trench which is positioned extremely outward is of a trench structure not having any gate electrode, that is, a gate-free structure. In further detail, the innermost terminal trench 621 is made into a structure internally incorporating a gate electrode to secure the design breakdown voltage, and the terminal trenches other than the above are made into a gate-free structure by which the breakdown voltage is deterred from being lowered and simultaneously compactness of the terminal area is achieved. That is, in order that it is compatible to secure the design breakdown voltage and to make the terminal area compact, it is preferable that the terminal trench 62 internally incorporating a gate electrode is limited to the innermost terminal trench 621.

Also, the end portion in the plate surface direction (the lateral direction in FIG. 2) of the P⁻ body region 41 is positioned between the terminal trenches 62 and 62. For this reason, the depletion layer spread in the plate surface direction is interrupted by the wall surface of the terminal trench 62. And, since the depletion layer which will spread in the thickness direction reaches the P floating region 53, the breakdown voltage is deterred from being lowered. Therefore, the terminal area is compact and the entire chip is resultantly made compact.

Figure 3:
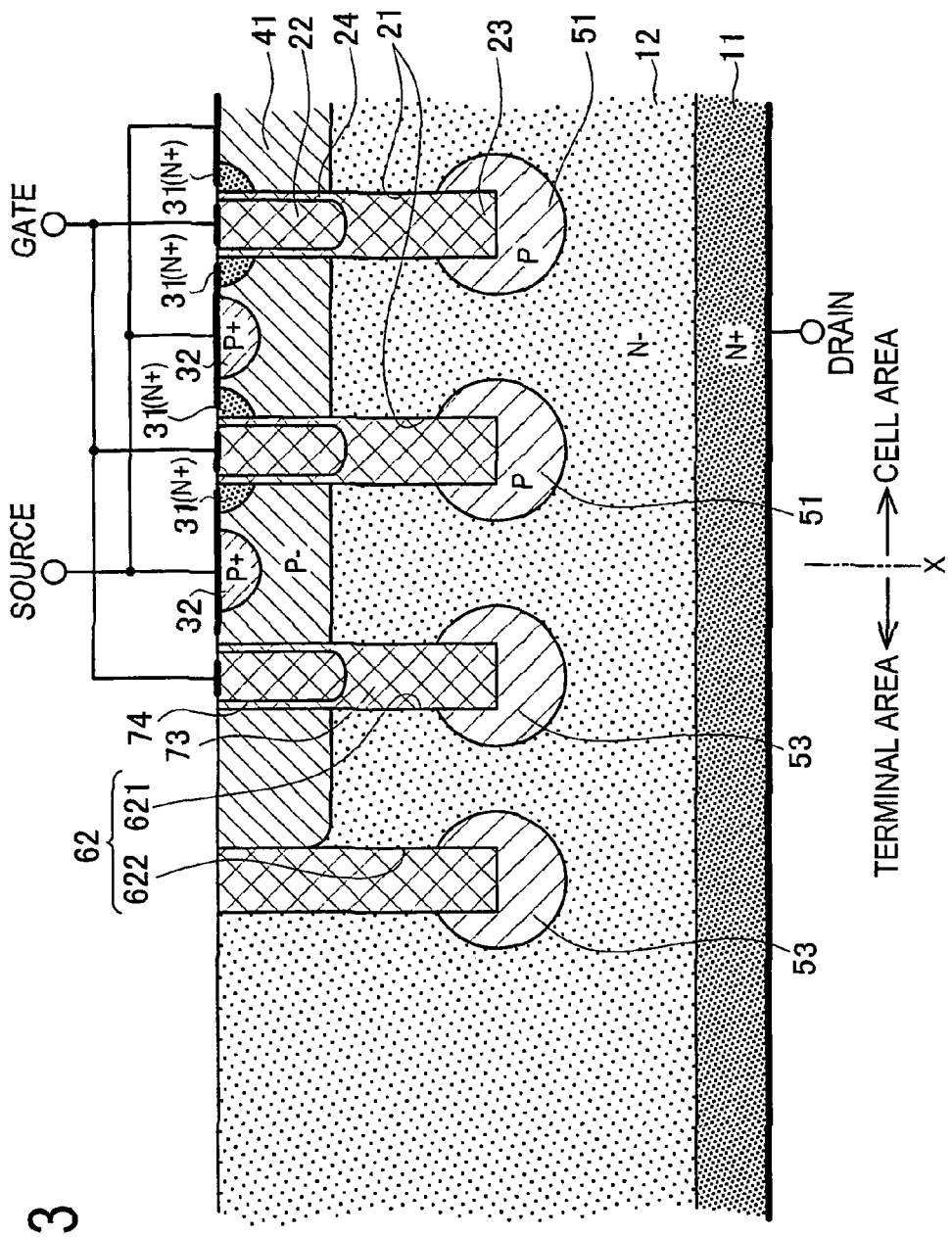
FIG. 3 is a view showing an insulation gate type semiconductor device in which the number of terminal trenches is two.
Figure 4:
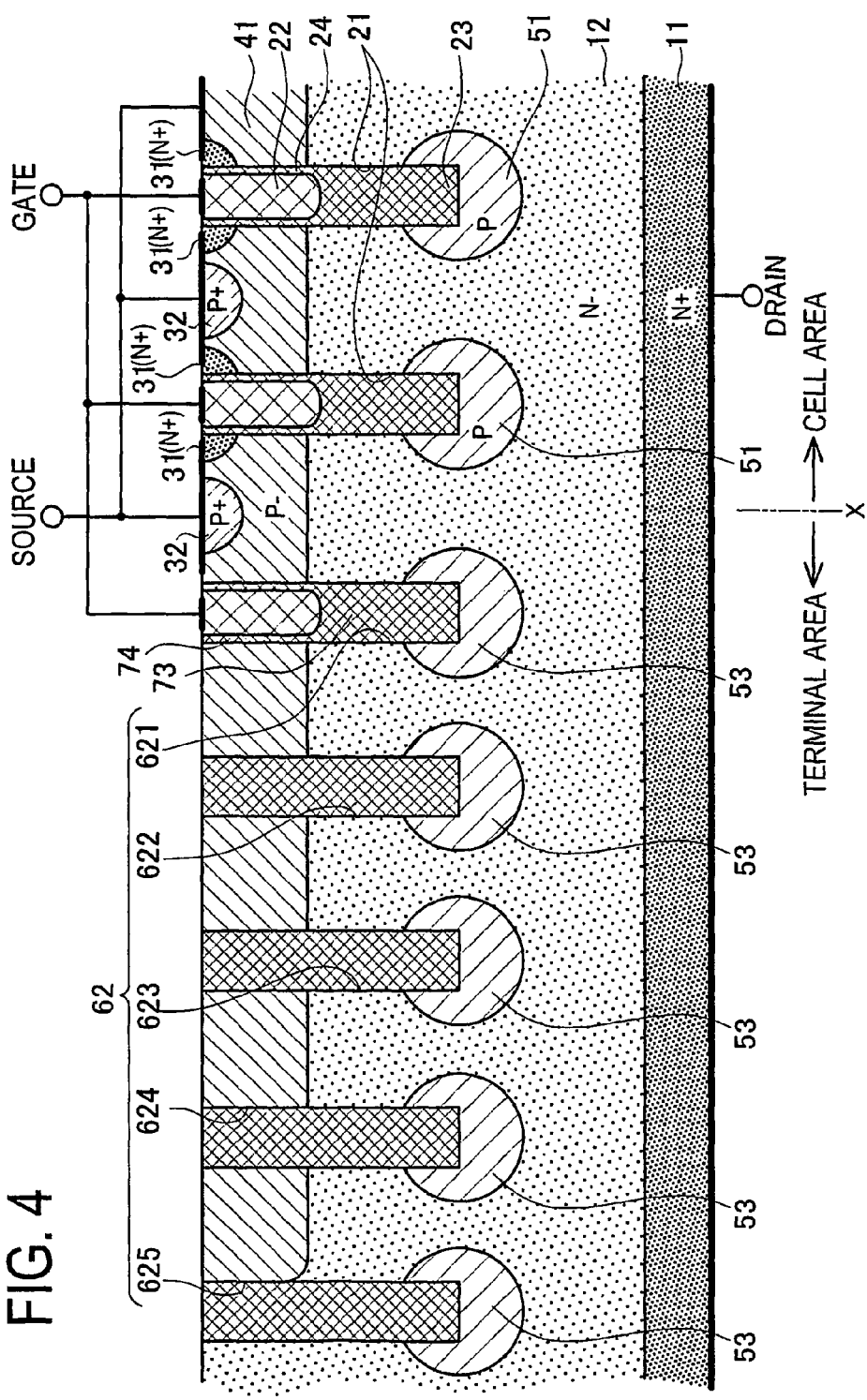
FIG. 4 is a view showing an insulation gate type semiconductor device in which the number of terminal trenches is five.

Also, it is not necessary that the number of terminal trenches 62 is limited to three. That is, if it is possible to retain the breakdown voltage, it may be acceptable that the number of terminal trenches 62 is two (the minimum number) as shown in FIG. 3. In addition, if it is difficult to retain the breakdown voltage with three terminal trenches, the number of terminal trenches 62 may be increased more than three as shown in FIG. 4. In either case, the gate electrode 72 is provided in the innermost terminal trench 621 as in the gate trench 21.

Subsequently, a description is given of a production process of the semiconductor device 100 shown in FIG. 1 and FIG. 2 with reference to FIG. 5 and FIG. 6. First, an N⁻ type silicon layer is formed on an N⁺ substrate, which becomes the N⁺ drain region 11, by epitaxial growth. The N⁻ type silicon layer (epitaxial layer) is a portion which is made into respective areas of the N⁻ drain region 12, P⁻ body region 41, N⁺ source region 31, and contact P⁺ area 32.

Next, the P⁻ body region 41 is formed on the upper surface side of a semiconductor substrate by ion implantation or the like. After that, the N⁺ source region 31 is formed, by ion implantation or the like, on the portion where the P⁻ body region 41 is formed. Therefore, as shown in FIG. 5(*a*), a semiconductor substrate having the N⁺ source region 31 and P⁻ body region 41 in order from the upper surface side is formed.

Next, a hard mask 91 such as an HTO (High Temperature Oxide) is formed on the semiconductor substrate, and a resist 90 is formed on the hard mask 91. And, patterning is carried out for the gate trench 21 and terminal trench 62. Next, after mask dry etching is carried out, trench dry etching is carried out. As shown in FIG. 5(*b*), the gate trenches 21 and the terminal trenches 62 are collectively formed by the trench dry etching, which passes through the P⁻ body region 41. After the trench dry etching is carried out, unnecessary resist 90 is removed.

Next, a sacrifice oxide film whose thickness is about 30 nm is formed on the respective wall surfaces of the respective trenches by a thermal oxidation process. The sacrifice oxide film is not to apply ion implantation to the sidewalls of the trenches.

Next, as shown in FIG. 5(*c*), for example, an impurity such as boron (B) is ion-implanted from the bottom surface of the respective trenches. After that, the wall surfaces of the respective trenches are smoothened by utilizing an isotropic etching method such as CDE (Chemical Dry Etching), and thereafter a thermal oxidation film whose thickness is 50 nm or so is formed. With the thermal oxidation film, it becomes possible to improve setting-in of an insulation film described later and at the same time to exclude influences due to the interface state. In addition, where the setting-in of the insulation is better carried out when a silicon surface is exposed, it is not required to form thermal oxide film. Unnecessary hard mask 91 is removed after ion implantation is carried out.

Next, as shown in FIG. 5(*d*), a deposition insulation layer 92 is deposited in the respective gate trenches 21 and respective terminal trenches 62 by the CVD (Chemical Vapor Deposition) method. For example, a silicon oxide layer formed by a low-pressure CVD method for which TEOS (Tetra-Ethyl-Orso-Silicate) is used as a material or a CVD method for ozone and TEOS are used as the material corresponds to the insulation layer 92. The insulation layer 92 is made into deposition insulation layers 23 and 73 in FIG. 2.

After that, a thermal diffusion process is carried out. Therefore, as shown in FIG. 5(*e*), the P floating region 51 and P floating region 53 are collectively formed. That is, the P floating regions in all the areas are simultaneously formed by a single time thermal diffusion process. Thereafter, a sacrifice oxidation layer is removed by wet etching, whereby a damaged layer produced by dry etching is removed. Further, after that, thermal oxidation is carried out at a temperature of about 900° C. through 1050° C. as the thermal oxidation process, thereby solidifying the junction points of the oxidation layer 92 by the CVD. After that, the oxidation film of the portion where gates are formed is removed (by 30 nm or so) by wet etching.

Next, a resist 96 is formed on the portion, excluding the upper part of the terminal trench 621, of the terminal area. And, dry etching is carried out with respect to the insulation layer 92, using the resist 96 as a mask, whereby a part of the insulation layer 92 is removed (etched back) as shown in FIG. 6(*f*), and a space to form the gate electrode is secured. After the etching, the resist 96 is removed.

Next, a thermal oxidation process is carried out, and a thermal oxidation film whose thickness is in a range from 40 nm through 100 nm is formed on the silicon surface. The thermal oxidation film is made into gate oxidation films 24 and 74 in FIG. 2. In detail, a thermal oxidation process is carried out at a temperature within a range from 900° C. through 1100° C. in an atmosphere of mixture gas of $H_2$ and $O_2$.

Figure 6:
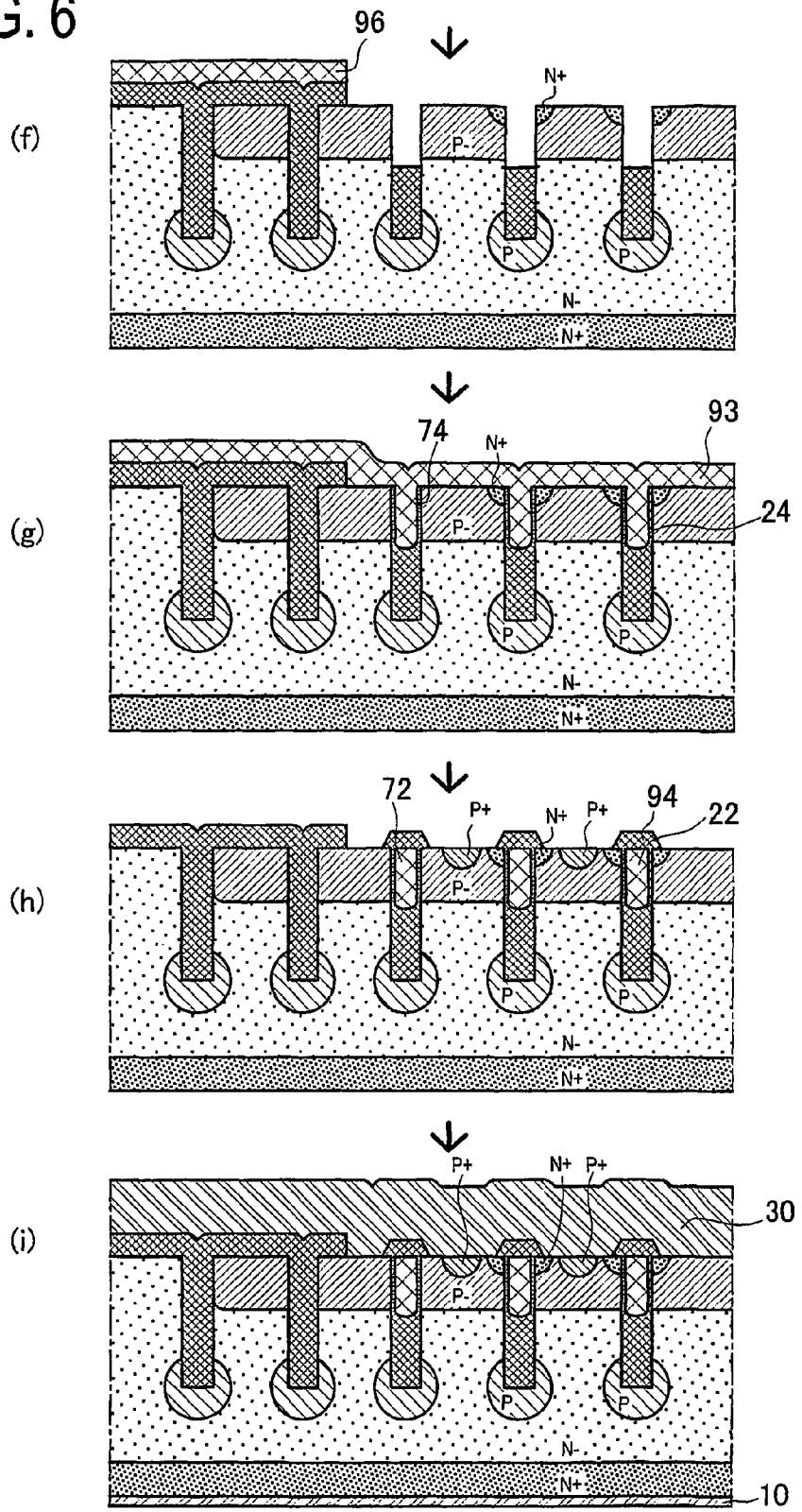
FIG. 6 is a view (Part 2) showing a process of producing a trench gate type semiconductor device shown in FIG. 2.

Next, a gate material 93 is deposited in a space secured by etching-back as shown in FIG. 6(*g*). In detail, film formation conditions of the gate material 93 are such that, for example, a reaction gas is a mixed gas including $SiH_4$, and the film formation temperature is 580° C. through 640° C. A polysilicon layer whose thickness is 800 nm is formed as an atmospheric pressure CVD method. The gate material 93 is made into the gate electrodes 22 and 72 in FIG. 2. Also, as the method for forming the gate electrodes 22 and 72, there are methods, one of which is a method for directly depositing a conductor in respective trenches, and the other of which is a method for diffusing impurities with respect to the insulation layer after a semiconductor having high resistance is once deposited.

Next, etching is carried out on the electrode layer which is the gate material 93. After that, an oxide film is formed on the surface of the electrode layer by carrying out cap oxidation. Thereafter, the P+ contact area 32 is formed by ion implantation, etc. Further, as shown in FIG. 6(h), an interlayer insulation layer 94 is formed on the semiconductor substrate. Finally, by forming the source electrode 30 and the drain electrode 10, etc., a trench gate type semiconductor device 100 is produced as shown in FIG. 6(i).

In the method for producing a semiconductor device 100 according to the embodiment, the formation process of the cell area is almost the same as that of the terminal area, wherein the trench etching step (b), ion implantation step (c) and thermal diffusion step (d) can be commonly used. Further, a step of forming a gate electrode, that is, an etching-back step, a step of depositing a gate material 93, and a step of forming the interlayer insulation layer 94 can be commonly used. For this reason, even if the gate electrode 72 is provided in the terminal area, the steps are simplified, and a lowering in production costs can be resultantly achieved.

[First Modified Version]

Figure 7:
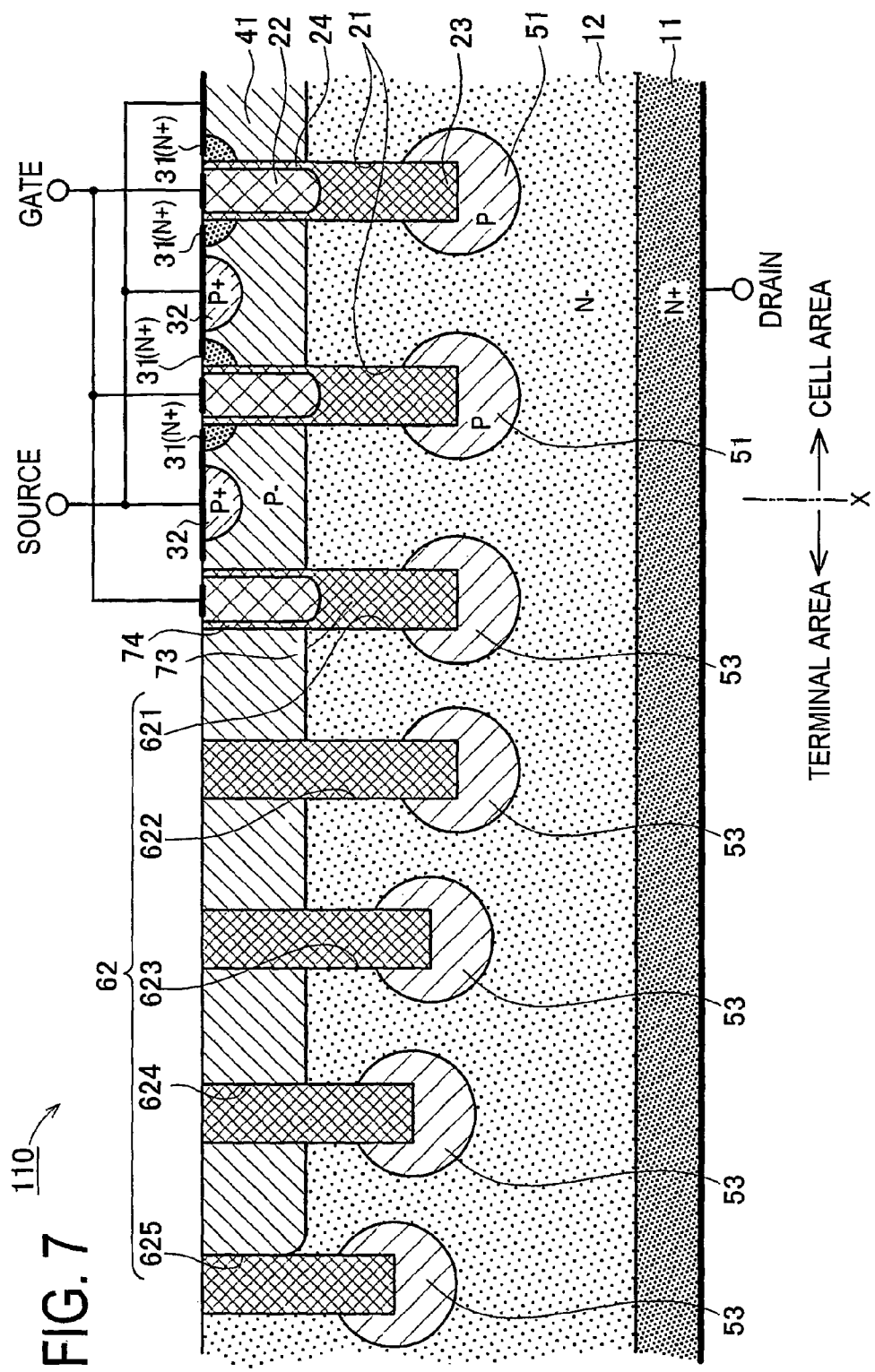
FIG. 7 is a sectional view showing a structure of an insulation gate type semiconductor device according to a first modified version.

A semiconductor device 110 according to the first modified version has a structure shown in the sectional view of FIG. 7. The semiconductor device 110 is featured in that the terminal trenches are made shallower as the position of the P floating region 53 of the terminal area is separated from the cell area.

Generally, in the semiconductor device, the smaller the curvature of the tip end part of the depletion layer is, concentration of the electric-field is relieved, the higher the breakdown voltage is. Therefore, in the semiconductor device 110, the depth of the terminal trench 62 in the terminal area is made gradually shallower as it is separated from the cell area. In detail, the depth of the innermost terminal trench 621 is deepest and the outermost terminal trench 625 is shallowest. Therefore, the position of the P floating region 53 formed by implanting impurities from the bottom part of the terminal trench 62 is made gradually shallower as the terminal trench is separated from the cell area. As a result, the thickness of the depletion layer is made thinner in line with separating from the cell area. That is, since the thickness of the depletion layer is made gradually thinner, the curvature of the depletion layer in the terminal area is made smaller in comparison with the semiconductor device 100 according to the first embodiment, wherein higher breakdown voltage is secured in comparison with the semiconductor device 100 according to the first embodiment.

[Second Modified Version]

Figure 8:
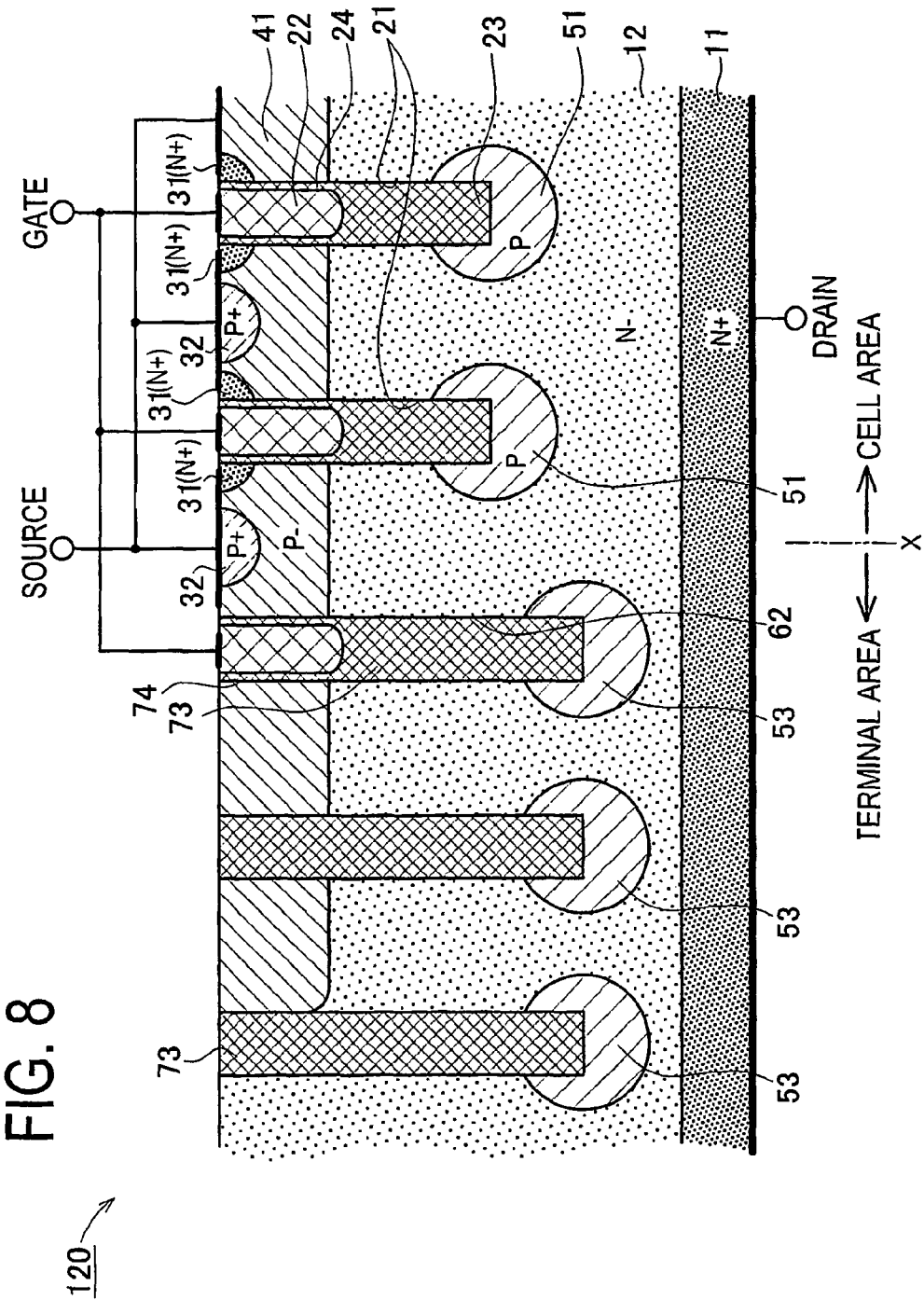
FIG. 8 is a sectional view showing a structure of an insulation gate type semiconductor device according to a second modified version.

A semiconductor device 120 according to the second modified version has a structure shown in the sectional view of FIG. 8. The semiconductor device 120 is featured in that the position of the P floating region 53 in the terminal area is deeper than the position of the P floating region 51 in the cell area.

In the trench gate type semiconductor device, an electric field is apt to be concentrated particularly on the bottom part of the gate electrode. As a matter of course, the electric field is concentrated on the bottom part of the gate electrode 72 in the terminal area. Also, since the terminal area is an inactive area, no $N^+$ source region 31 is provided. Based thereon, the electric field is further apt to be concentrated on the gate electrode 72. Since the $N^+$ source region 31 is not provided in the terminal area, no breakdown current flows. Therefore, as insulation breakdown occurs in the terminal area, there is a fear that the gate oxidation film 74, etc., is broken down. Accordingly, the position of the P floating region 53 in the terminal area is made deeper than the position of the P floating region in the other areas, wherein since the thickness of the depletion layer in the terminal area is made thicker than the thickness of the cell area, thereby the breakdown voltage is high in the terminal area in comparison with the cell area and insulation breakdown in the terminal area can be deterred.

Also, with respect to the thickness of the $N^-$ drift region 12, it is necessary that such thickness as sufficiently spreads in the thickness direction of the depletion layer formed in at least the terminal area is secured. For this reason, the $N^-$ drift region 12 in the cell area is made into a state where an elongation amount of the depletion layer further remains than in the terminal area.

Two methods can be considered to make the position of the P floating region 53 deeper than the position of the P floating region 51 in the cell area. One of the methods is for making the acceleration voltage in ion implantation higher than that in the other areas. With this method, the acceleration voltage to form the P floating region 53 is made higher than the acceleration voltage to form the P floating regions 51 and 52.

Figure 9:
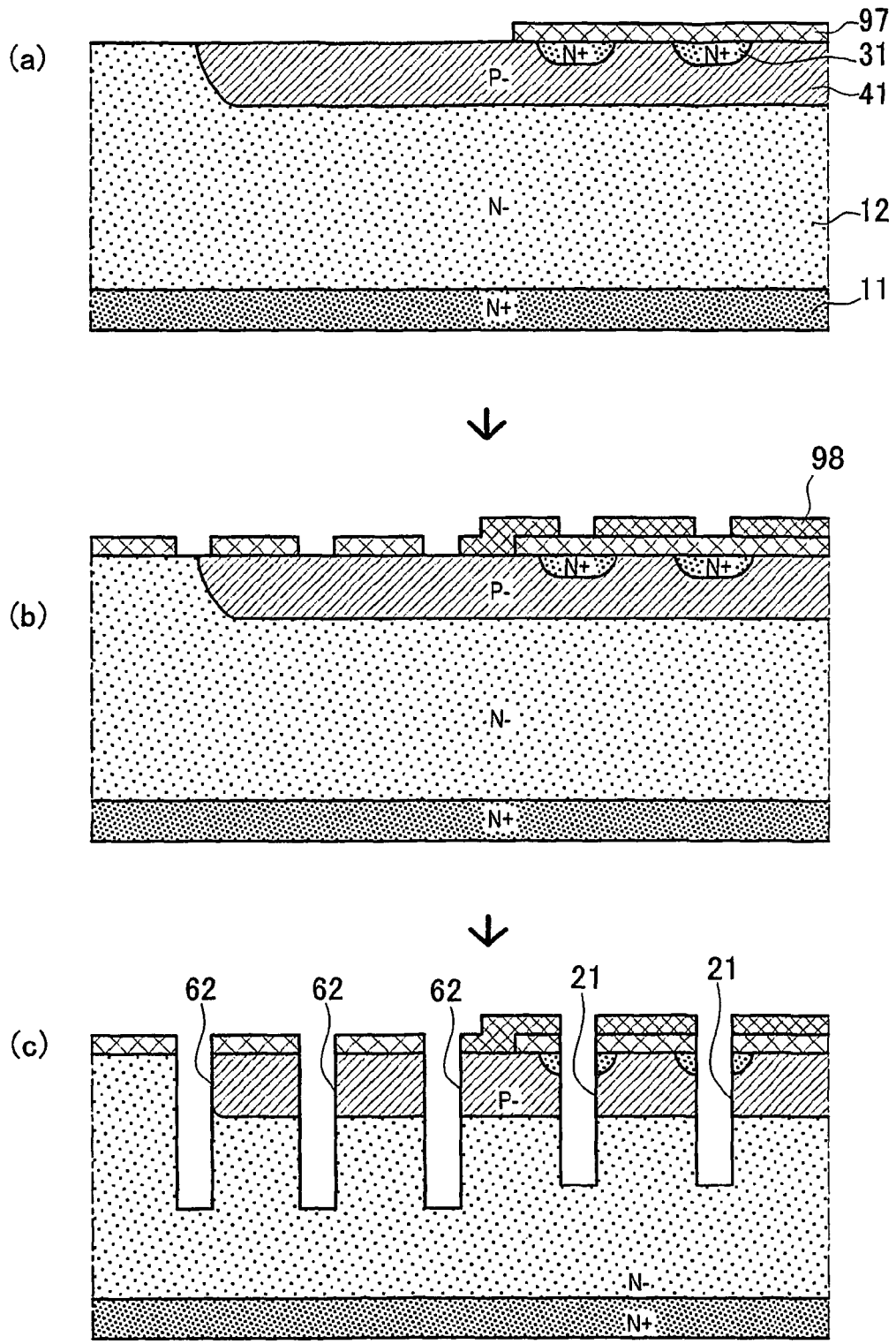
FIG. 9 is a view showing a process of producing the trench gate type semiconductor device shown in FIG. 8.

The other method is for making the depth of the gate trench 81 deeper than that of the other gate trenches. In order to produce such a semiconductor device, trench etching in the terminal area and trench etching in the cell area are separately carried out, wherein trenches are engraved to respective predetermined depths or the process is subjected to the procedure shown in FIG. 9. In the procedure, as shown in FIG. 9(a), a protective layer 97 is formed in advance at the portions where shallower trenches (in the embodiment, the gate trenches 21) are formed. After that, a hard mask 98 is formed on the semiconductor substrate, and, as shown in FIG. 9(b), patterning of the respective trenches is carried out with respect to the hard mask 98. The etching rate in the protective layer 97 is made different from the etching rate in the hard mask 98. In this state, by carrying out the trench dry etching, it is possible to form trenches whose depths differ from each other, as shown in FIG. 9(c). For example, it is assumed that the protective layer 97 is $SiO_2$, the hard mask 98 is HTO, and drying etching is carried out by using $CH_4$, $CHF_3$, Ar, etc. Since, in the procedure shown in FIG. 9, it is possible to finish the trench dry etching in only one time, the production process is simple. By making the trench depths deep by about 0.2 μm according to these methods, the breakdown voltage between D and S is increased about 3V. Also, a semiconductor device 300 shown in FIG. 8 is based on the procedure shown in FIG. 9.

[Third Modified Version]

Figure 10:
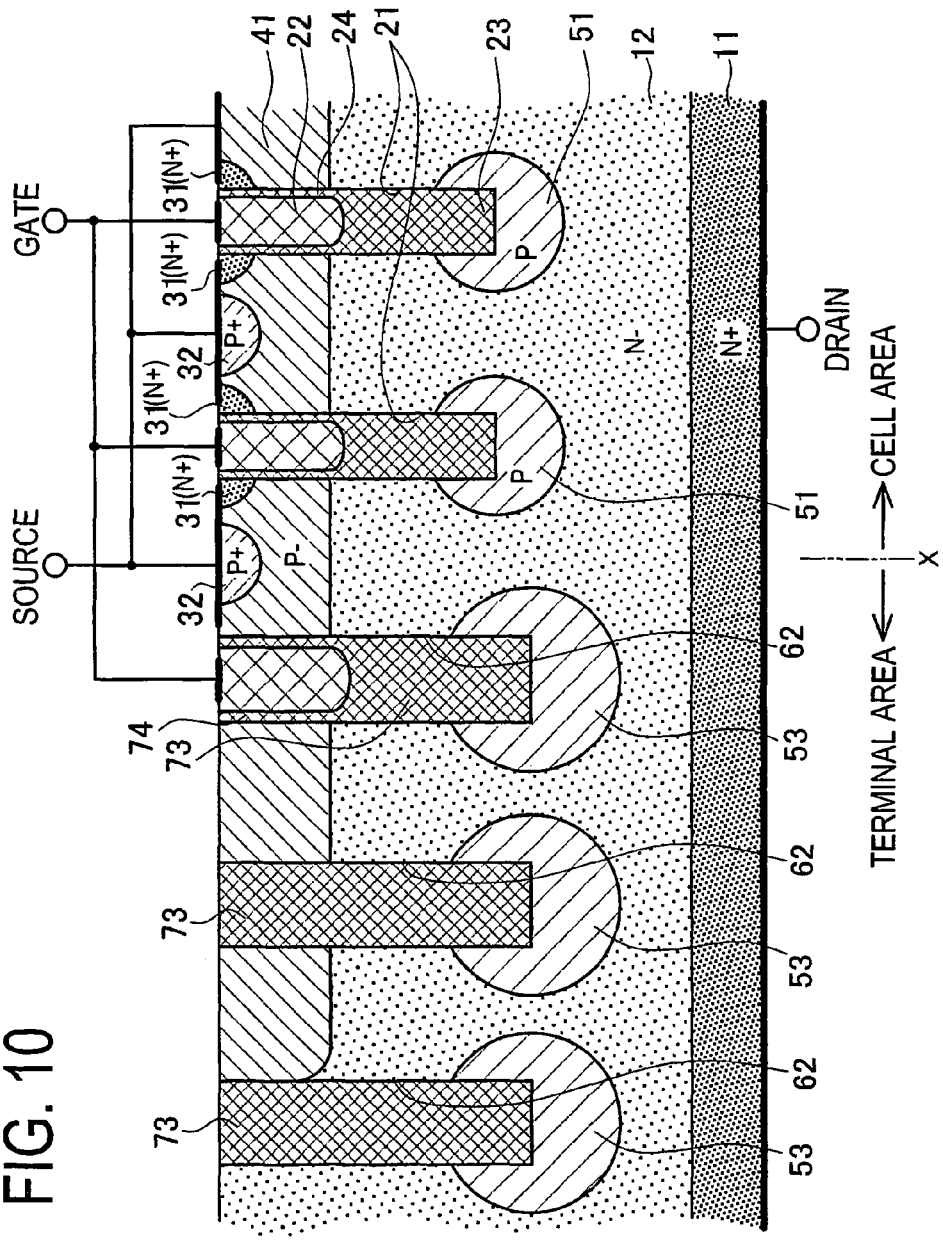
FIG. 10 is a sectional view showing a structure of an insulation gate type semiconductor device according to a third modified version.

A semiconductor device 130 according to the third modified version has a structure shown in the sectional view of FIG. 10. The semiconductor device 130 is featured in that the groove width of the terminal trench 62 is wider than the groove width of the gate trench 21. That is, even in a case where etching is carried out under the same conditions, etching is carried out to a deeper position in the trenches having a wide groove width than in the trenches having a narrow groove width by the micro loading effect. Further, based on the wider groove width, the P floating region 53 is greater in size than the P floating region 51, wherein it is possible to deepen the position of the P floating region only by widening the groove width of the trenches. Therefore, as in the second modified version, the thickness of the depletion layer in the terminal area is made thicker than the thickness thereof in the cell area. Accordingly, the terminal area has higher breakdown voltage than the cell area, and it is possible to deter insulation breakdown in the terminal area.

As described in detail above, in the semiconductor device 100, the breakdown voltage is deterred from being lowered in the cell area by the gate trench 21 internally incorporating the gate electrode 22 and the P floating region 51 positioned downward of the gate trench 21. Also, the breakdown voltage is deterred from being lowered in the terminal area by the terminal trenches 62 surrounding the cell area and the P floating region 53 positioned downward of the terminal trenches 62. Further, the gate electrode 72 is provided in the innermost terminal trench 621 of the terminal trenches 62. It is possible to securely connect the depletion layer formed from the PN junction point with the P⁻ body region 41 to the depletion layer formed from the P floating region 53 in the vicinity of the terminal trench 621 by the gate electrode 72. Furthermore, it is possible to securely connect the depletion layer formed from the P floating region 51 to the depletion layer formed from the P floating region 53. For this reason, depletion in the N⁻ drift region 12 can reliably be achieved, and high breakdown voltage of the semiconductor device can reliably be achieved.

Also, in the terminal area, the depletion layer spread in the plate surface direction of the semiconductor substrate is interrupted by the terminal trench 62. Therefore, the shape of the tip end portion of the depletion layer is flattened, and concentration of the electric field is relieved. And, it is possible to further relieve the peak of the electric field intensity by the P floating region 53. That is, high breakdown voltage can be achieved without increasing the size of the terminal area, and it is possible to easily achieve compactness of the entire semiconductor device. Therefore, an insulation gate type semiconductor device in which both high breakdown voltage and compactness can be obtained is achieved.

Also, in the semiconductor device 100, the gate trench 21 positioned in the cell area and the terminal trenches 62 positioned in the terminal area are formed at the same time. Further, the P floating regions 51, 53, deposition insulation layers 23, 73 and gate electrodes 22, 72 are simultaneously processed and formed. That is, a step of forming the gate electrodes can be commonly used for the cell area and terminal area in addition to the step of forming the trenches and P floating regions. Therefore, even if the gate electrode 72 is provided in the terminal area, the production process is simple as in the semiconductor device 100.

Further, the embodiments are merely examples that do not limit the invention. Therefore, it is a matter of course that the invention can be subjected to various improvements and modifications within the scope not departing from the spirit of the invention. For example, in the respective semiconductor areas, P type and N type may be replaced. Also, the gate insulating film 24 is not limited to an oxidation film, but may be any other type of insulation film such as a nitride film, etc., or may be a composite film. In addition, the semiconductor is not limited to silicon, but may be any other type of semiconductor (SiC, GaN, GaAs, etc.). Also, the insulation gate type semiconductor device according to the embodiment may be applicable to a transmissivity modulation type power MOS using a P type substrate.

Figure 11:
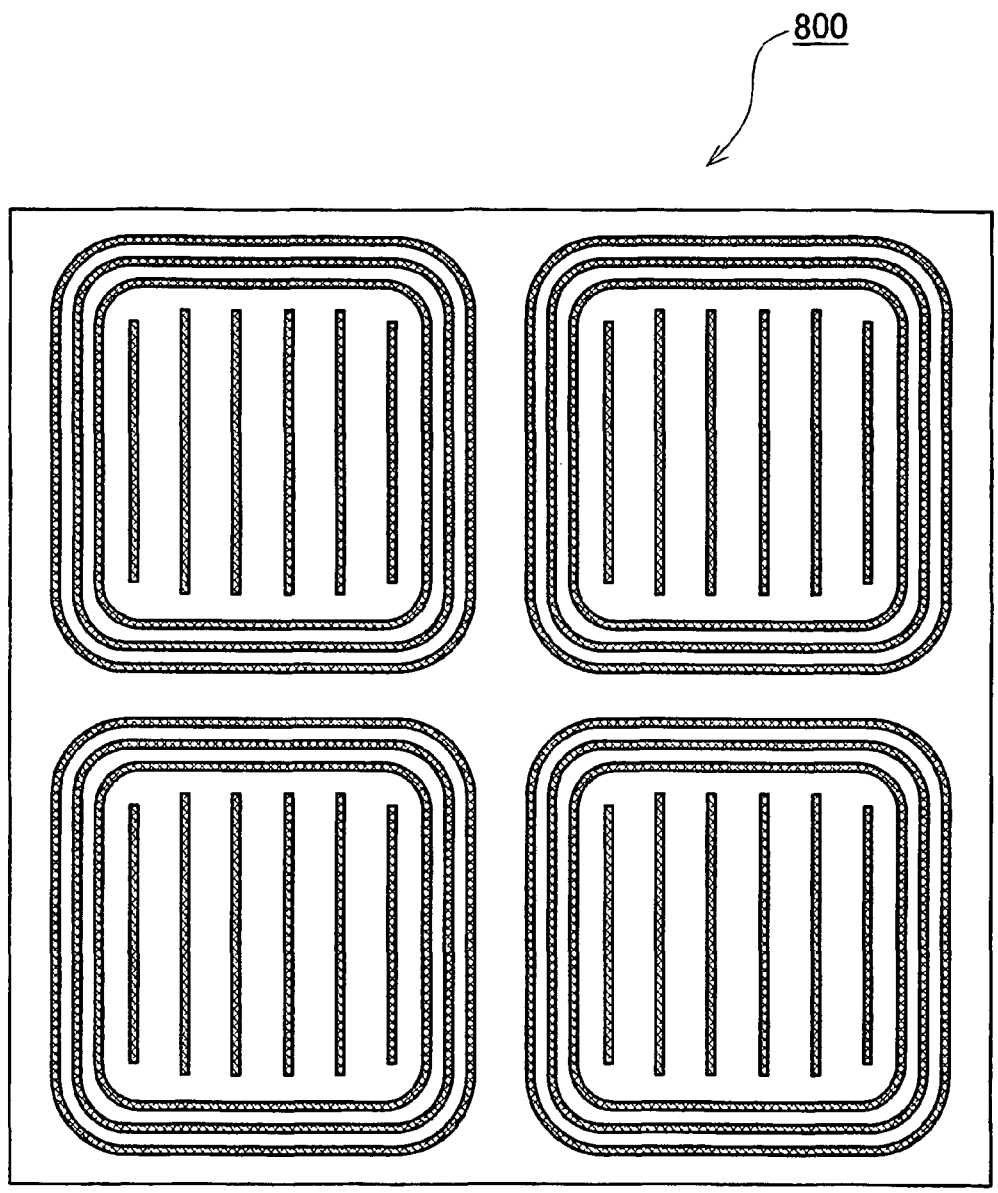
FIG. 11 is a plan view showing a structure of an insulation gate type semiconductor device whose chip area is large.

Also, in the embodiment, although the semiconductor device is composed of one cell area and one terminal area, the invention is not limited thereto. That is, in a semiconductor device having a wide chip area, as shown in FIG. 11, cell areas may be provided in a plurality of points, and annular terminal areas which surround the cell areas may be provided with respect to the respective cell areas.

Figure 12:
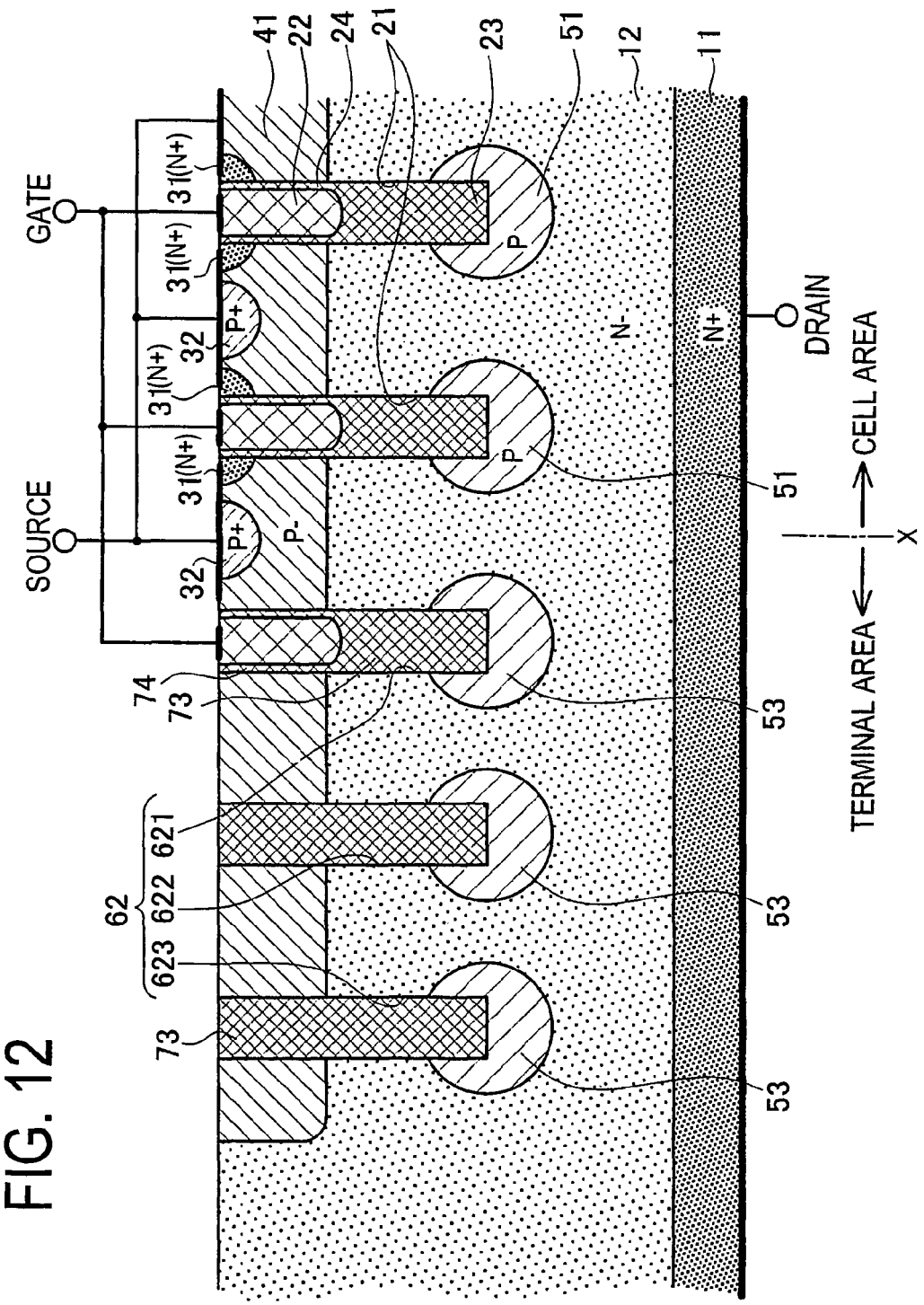
FIG. 12 is a plan view showing a structure (Part 1) of an insulation gate type semiconductor device in which the end portion of the body region is positioned outside the terminal trench.
Figure 13:
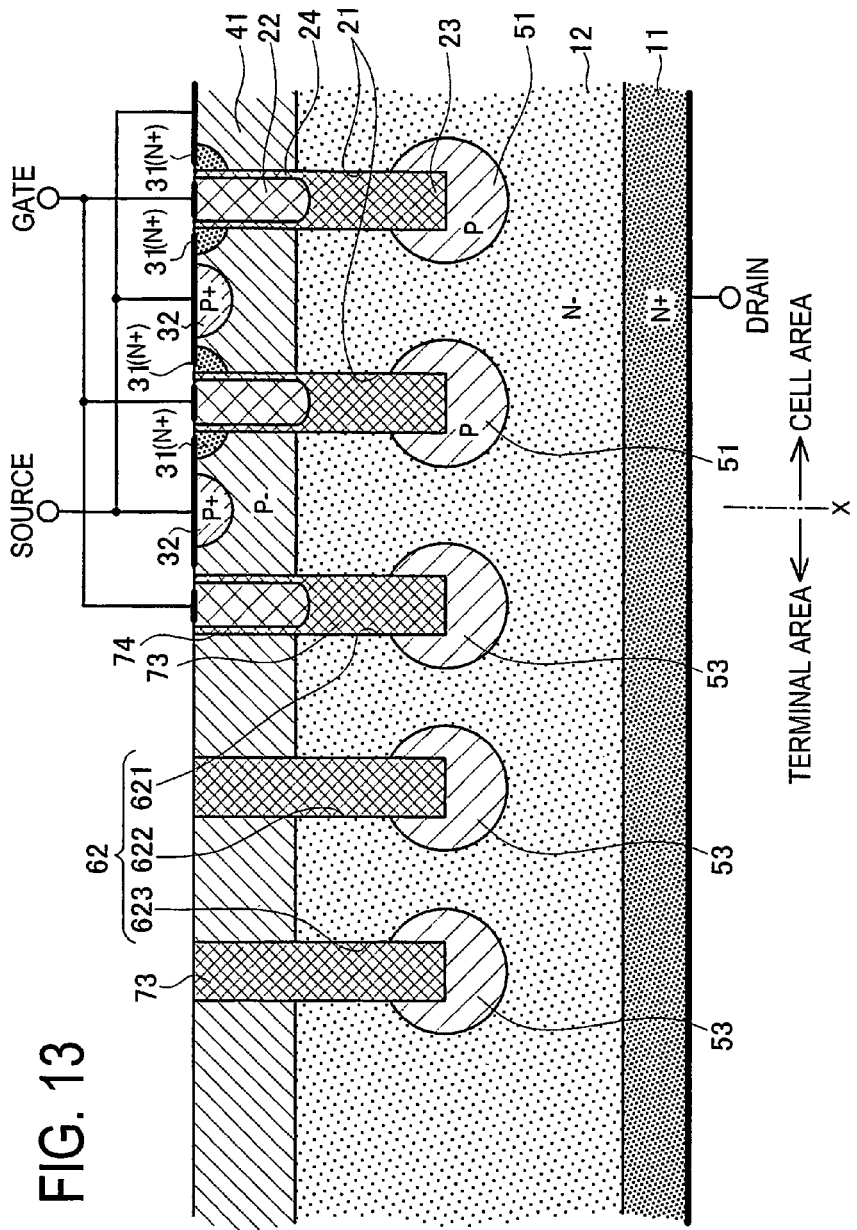
FIG. 13 is a plan view showing a structure (Part 2) of an insulation gate type semiconductor device in which the end portion of the body region is positioned outside the terminal trench.
Figure 14:
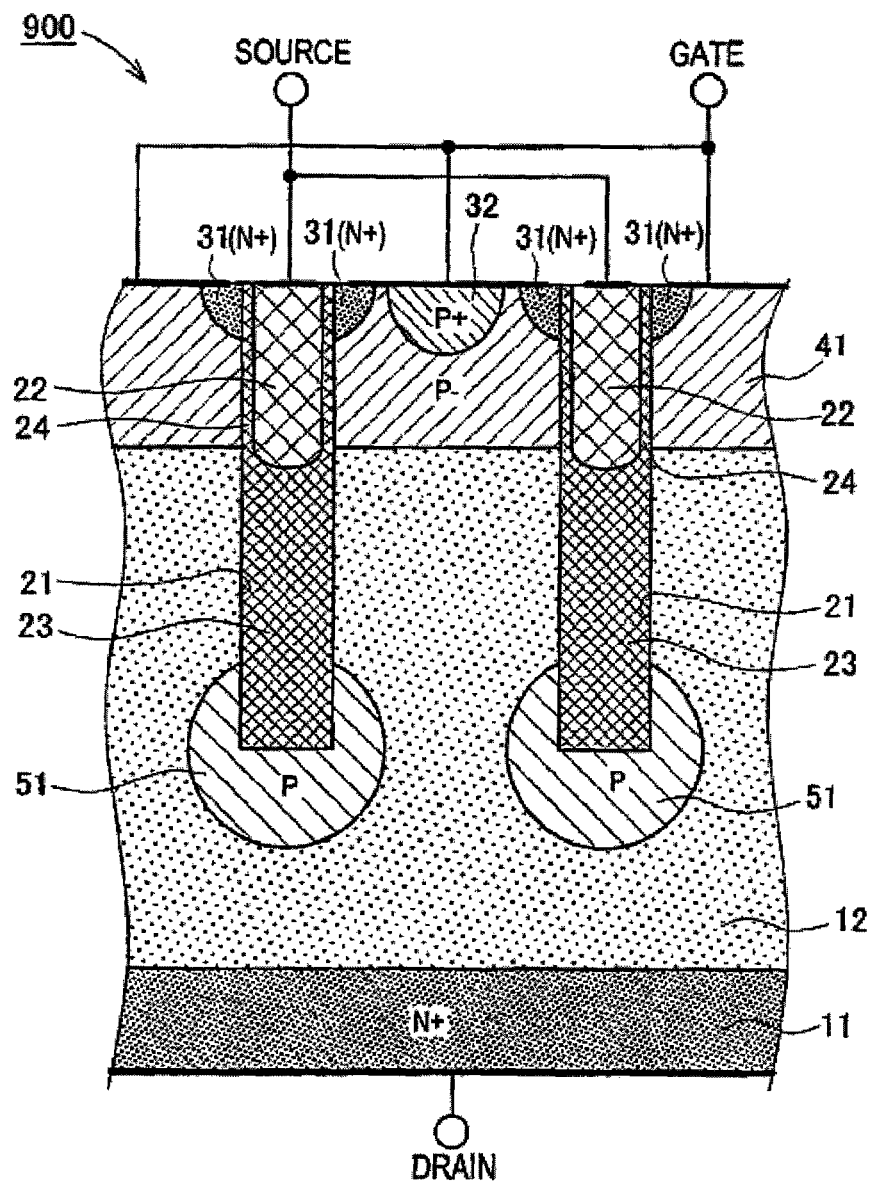
FIG. 14 is a sectional view showing a structure of a prior art insulation gate type semiconductor device.
Figure 15:
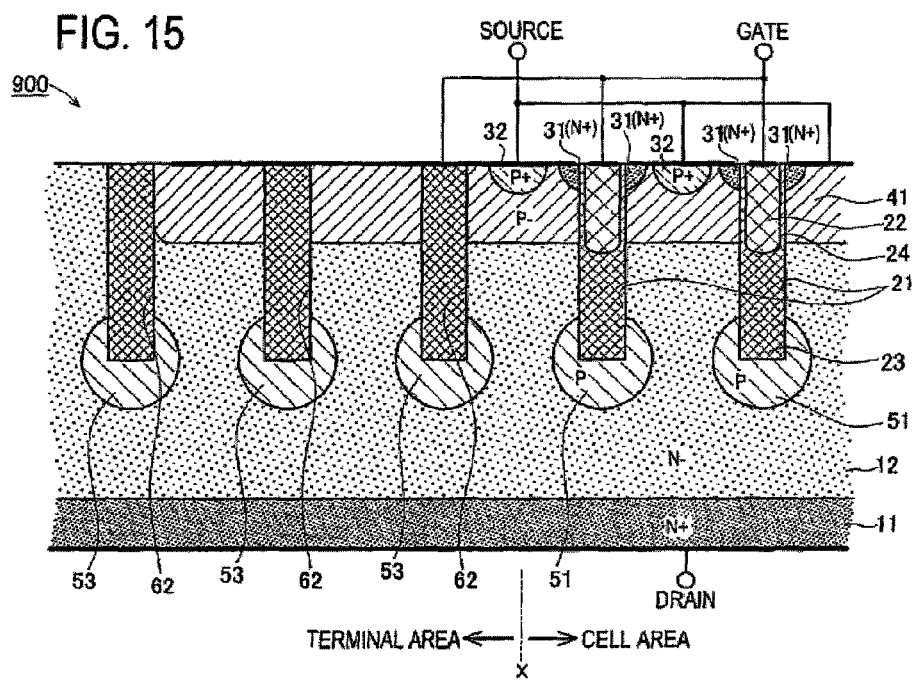
FIG. 15 is a sectional view showing a structure of the terminal area of the semiconductor device of such a type as shown in FIG. 14.

Also, in the embodiment, although the end portion in the plate surface direction of the P⁻ body region is positioned between the terminal trenches 62 and 62, the invention is not limited thereto. That is, as shown in FIG. 12, the end portion in the plate surface direction of the P⁻ body region 41 may be positioned outside the terminal trench 62 group. Or, as shown in FIG. 13, the P⁻ body region 41 may be formed on the entire surface of the semiconductor device. In these cases, although the breakdown voltage may be lowered, slight variations in formation of the P⁻ body region 41 are acceptable. Therefore, production thereof can be facilitated.

INDUSTRIAL APPLICABILITY

According to the invention, by providing a gate electrode in the innermost trench portion of the trench portion adjacent to the cell area, that is, in the second trench portion group, spread of the depletion layer in the vicinity of the trench portion is not different from spread of the depletion layer in the cell area. For this reason, design breakdown voltage can reliably be secured. Further, since the depletion layer spread toward the terminal area is interrupted by the second trench portion group and a lowering in the breakdown voltage is deterred by the second floating region, the terminal area is made compact. Therefore, an insulation gate type semiconductor device and a method for producing the same, in which both high breakdown voltage and compactness are secured, are brought about.

The invention claimed is:

1. An insulation gate type semiconductor device including a body region which is positioned on an upper surface inside a semiconductor substrate and is a first conductive type semiconductor; and a drift region which is in contact with the downward of the body region and is a second conductive type semiconductor; comprising:
    a first trench portion group passing through the body region in the thickness direction of the semiconductor substrate, positioned in a cell area, and each gate trench of the first trench portion group internally incorporating a first gate electrode;
    first floating regions enclosed by the drift region and surrounding a bottom portion of at least one trench portion in the first trench portion group, which is the first conductive type semiconductor;
    a second trench portion group passing through the body region in the thickness direction of the semiconductor substrate, positioned in a terminal area surrounding the cell area, and formed to be annular so as to surround the cell area when being viewed from above; and
    second floating regions enclosed by the drift region and surrounding a bottom portion of at least one trench portion in the second trench portion group, which is the first conductive type semiconductor;
    wherein the semiconductor device is adapted such that electric field strength peak at two places in the semiconductor substrate in a thickness direction: at a PN junction between the first or second floating regions and the drift region; and at a PN junction between the body region and the drift region;
    wherein a second gate electrode is internally incorporated in at least the innermost positioned trench portion in the second trench portion group;
    wherein a lower end of the second gate electrode in the second trench portion group is equal to a lower end of the first gate electrode in the first trench group in a position in the substrate in the thickness direction.

2. The insulation gate type semiconductor device according to claim 1, wherein at least the outermost positioned trench portion in the second trench portion group includes a gate-free structure.

3. The insulation gate type semiconductor device according to claim 1, wherein the second gate electrode is internally incorporated in only the innermost positioned trench portion in the second trench portion group.

4. The insulation gate type semiconductor device according to claim 1, wherein the pitches of respective trench portions in the second trench portion group are narrower than those of respective trench portions in the first trench portion group.

5. The insulation gate type semiconductor device according to claim 1, wherein the inner trench portion of adjacent trench portions in the second trench portion group is deeper than the other.

6. The insulation gate type semiconductor device according to claim 1, wherein trench portions of the second trench portion group are deeper than trench portions of the first trench portion group.

7. The insulation gate type semiconductor device according to claim 6, wherein the width of trench portions of the second trench portion group is wider than the width of trench portions of the first trench portion group.

8. The insulation gate type semiconductor device according to claim 1, wherein the body region extends laterally to the outermost trench portion in the second trench portion group at a maximum.

* * * * *